United States Patent
Gabara et al.

[11] Patent Number: 6,157,215
[45] Date of Patent: Dec. 5, 2000

[54] METHOD AND APPARATUS FOR CONTROLLING IMPEDANCE

[75] Inventors: Thaddeus J. Gabara, Murray Hill, N.J.; Stefan A. Siegel, Upper Macungie Township, Lehigh County, Pa.

[73] Assignee: Lucent Technologies, Inc., Murray Hill, N.J.

[21] Appl. No.: 09/106,284

[22] Filed: Jun. 29, 1998

[51] Int. Cl.[7] ........................ H03K 17/16; H03K 19/003
[52] U.S. Cl. .................................. 326/83; 326/30
[58] Field of Search .................. 326/21, 30, 83, 326/86, 87, 119, 121

[56] References Cited

U.S. PATENT DOCUMENTS

| | | | |
|---|---|---|---|
| 4,719,369 | 1/1988 | Asano et al. | 307/443 |
| 4,760,292 | 7/1988 | Bach | 326/86 |
| 5,243,229 | 9/1993 | Gabara et al. | 307/98 |
| 5,457,407 | 10/1995 | Shu et al. | 326/30 |
| 5,726,589 | 3/1998 | Cahill et al. | 326/81 |

OTHER PUBLICATIONS

U.S. application Ser. No. 09/083,172, Gabara et al., Filed May 22, 1998.

Gabara et al., "Digitally Adjustable Resistors in CMOS for High–Performance Applications", IEEE Journal of Solid State Circuits, vol. 27, No. 8, Aug. 1992, pp. 1176–1185.

Gabara et al., "Forming Damped LRC Parasitic Circuits in Simultaneously Switched CMOS Output Buffers", IEEE Journal of Solid State Circuits, vol. 32, No. 3, Mar. 1997, pp. 407–417.

*Primary Examiner*—Michael Tokar
*Assistant Examiner*—Daniel D. Chang
*Attorney, Agent, or Firm*—Dickstein Shapiro Morin & Oshinsky LLP

[57] ABSTRACT

A passive resistive element is provided in series with a digital variable impedance to produce a highly linear output impedance for a transmission path over a wide range of operating conditions.

37 Claims, 8 Drawing Sheets

METHOD AND APPARATUS FOR CONTROLLING IMPEDANCE

BACKGROUND OF THE INVENTION

1. Field of the Invention

This invention relates generally to integrated circuits having buffers and, more particularly, to a controlled impedance circuit using metal-oxide semiconductor (MOS) technology.

2. Description of the Related Art

In signal transmission environments, digital signals may be transmitted relatively long distances over a transmission line. A transmission line may be a bus, a printed circuit board trace, or any other type of conductive line capable of transporting a digital signal. Typically, for long distance a transmission line has a characteristic impedance of 50 to 75 ohms.

Substantial variations can occur in the performance of integrated circuits simply because the manufacturing processes that are employed cannot be carried out with the desired precision. Indeed, it is not uncommon to find substantial performance variation between integrated circuits of identical design which are manufactured on a single semiconductor wafer but at different locations on the wafer. This includes variations in signal delay (speed), frequency response, and power consumption.

Designers who intend to use integrated circuits must account for all possible variations in ICs' performance. Consequently, in many circumstances designers develop worst case designs, which are designs that assume all IC parameters, or characteristics, to be at their worst specified levels. Manufacturers typically specify, among other things, the minimum and maximum values of both speed and power characteristics of their ICs. That means, of course, that the manufacturer must assure itself somehow that the integrated circuits do lie within the promised bounds of operational characteristics.

In turn, that means that integrated circuits which lie outside the promised bounds have to be discarded as defective. Being able to narrow the variation in speed and power consumption of manufactured ICs would result in higher yield for the IC manufacturer and more desirable integrated circuits for the designer.

An issue related to speed and power dissipation of elements throughout the integrated circuit is the creation of specific impedances that are presented at input/output terminals of the integrated circuits. When signals exit an IC terminal, flow along a signal path over an appreciable distance and enter another IC terminal, signal reflections can be experienced from impedance discontinuities at any point along the signal path, and specifically from the terminals. Most reflections can cause considerable problems in both digital and analog environments (e.g., misdetection of digital signals). It is well known, however, that when the signal path is viewed as a transmission line with a characteristic impedance, undesirable reflections are eliminated when the transmission line is terminated at the sending and/or receiving ends with impedances having a value equal to the characteristic impedance of the transmission line. In other words, what is needed for effective transmission of very high frequency signals through signal paths of appreciable length are integrated circuits where both input and/or output signal terminals have specified and well controlled impedances.

FIG. 1 presents an idealized view of an output terminal 10 that delivers a digital signal to a transmission line 200. The output drive stage of circuitry 100 that is associated with terminal 10 is idealized with impedances 11 and 13. Impedance 11 has one lead connected to fixed positive potential +V through terminal 21 and the other lead connected to one lead of controllable switch 12. The other lead of switch 12 is connected to terminal 10. Similarly, a resistor 13 is connected to a ground potential 19 through a terminal 22 and to controllable switch 14. Like switch 12, switch 14 has one lead connected to terminal 10.

Switch 14 is controlled by a digital input signal $S_{in}$, and switch 12 is controlled by its logic inverse, $S'_{in}$, so that one switch is closed while the other is open. When switch 14 is closed and switch 12 is open, current flows from transmission line 200 to the ground potential 19, and the impedance that this current encounters is impedance 13. When switch 14 is open and switch 12 is closed, current flows from the fixed positive potential +V into transmission line 200, and the impedance encountered by this current is impedance 11. Ideally, impedances 11 and 13 are equal to each other and set to correspond to the characteristic impedance of the transmission line; e.g., 50 ohms.

FIG. 2 presents a diagrammatic view of the FIG. 1 arrangement. It includes digital impedance circuits 20 and 30. Digital impedance circuit 20 is responsive to input signal $S_{in}$. Input signal $S_{in}$ is applied through input terminal 26 and the ground potential 19 is applied through ground potential terminal 22. Digital impedance circuit 30 is responsive to signal $S'_{in}$ which is the inverse of $S_{in}$ derived via inverter 15. Input signal $S'_{in}$ is applied through input terminal 36 and the positive potential +V is applied through terminal 21. The outputs 23, 33 of impedance circuits 20 and 30 are interconnected and applied to output terminal 10. To provide for the digital control of the impedance value, impedance circuit 20 is responsive to digital control signal bus 21 and impedance circuit 30 is responsive to digital control signal bus 31. The digital impedance circuits 20, 30 are in the form of digitally adjustable transistor arrays, which may be of the type disclosed in U.S. Pat. Nos. 5,243,229 issued to Gabara et al., the disclosure of which is hereby incorporated by reference.

FIG. 3 is an example of a digital transistor array used as the digital impedance circuit 20 (block 30 is of similar construction). As shown, digital transistor array (DTA) 20 comprises a parallel interconnection of MOS transistors 24 between a fixed potential terminal, here ground potential terminal 22 and the output transmission line 23. In controlling impedance values, this arrangement basically represents a parallel connection of resistive paths. The number of transistors 24 used is a design choice. Each of transistors 24 is controlled (at its gate terminal) with a NOR gate 25. Gates 25 are two input gates. One input of gates 25 is connected to input terminal 26 which receives a digital logic signal. The remaining inputs of gates 25 are combined to form a digital control bus (21) which receives control signals for activating selected gates 25. The basic idea behind the FIG. 3 structure is that a number of transistors 24 are fully turned on by applied control signals on bus 21 and by the logic level of an incoming digital logic signal on line 26 which thereby places one or more selected transistors in a low impedance state during one of the "high" or "low" states of the digital logic signal. By placing one or more of transistors 24 in their low impedance state through the applied control signal, the effective impedance of impedance circuit 20 can be lowered to a desired value. The transistors 24 are all turned off during the other of the "high" and "low" states of the digital signal.

Accordingly, if the dimensions of the transistors are carefully sized, and the manufacturing process, operating temperature and power supply voltage $V_{DD}$ are properly controlled, the digitally adjusted transistor array is able to produce a proper logic level output signal through an impedance which matches the transmission line's impedance. Unfortunately, CMOS transistors have very non-linear I–V characteristics. Referring now to FIG. 4, it can be seen that CMOS transistors have a very small linear region 35 and a much larger non-linear region 32. The slope of these regions 35, 32 represents the impedance of the transistors 24. The typical linear region 35 spans only a few tenths of a volt. Therefore, when a drain-to-source voltage becomes greater than a few tenths of a volt, the output impedance Z of the circuit increases dramatically regardless of the width of the transistors. In addition, the output impedance Z will also be altered by any variations in the manufacturing process, operating temperature and power supply voltage $V_{DD}$.

Accordingly, it is difficult to produce a linear output over a large portion of the drain to source voltage swing, which makes it difficult to accurately provide a linear output impedance.

SUMMARY OF THE INVENTION

According to the present invention, a passive impedance, such as a resistor is connected in series with a digitally adjusted transistor array to produce an impedance matching component having a highly linear output impedance over a wide range of operating conditions. According to one preferred embodiment, a passive resistor is provided between the digitally adjusted transistor array and an output terminal which connects to a transmission line. According to another preferred embodiment, a single passive resistor is provided between a pair of digitally adjusted transistor arrays and a single output terminal.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF THE PREFERRED EMBODIMENTS

Figure 5:
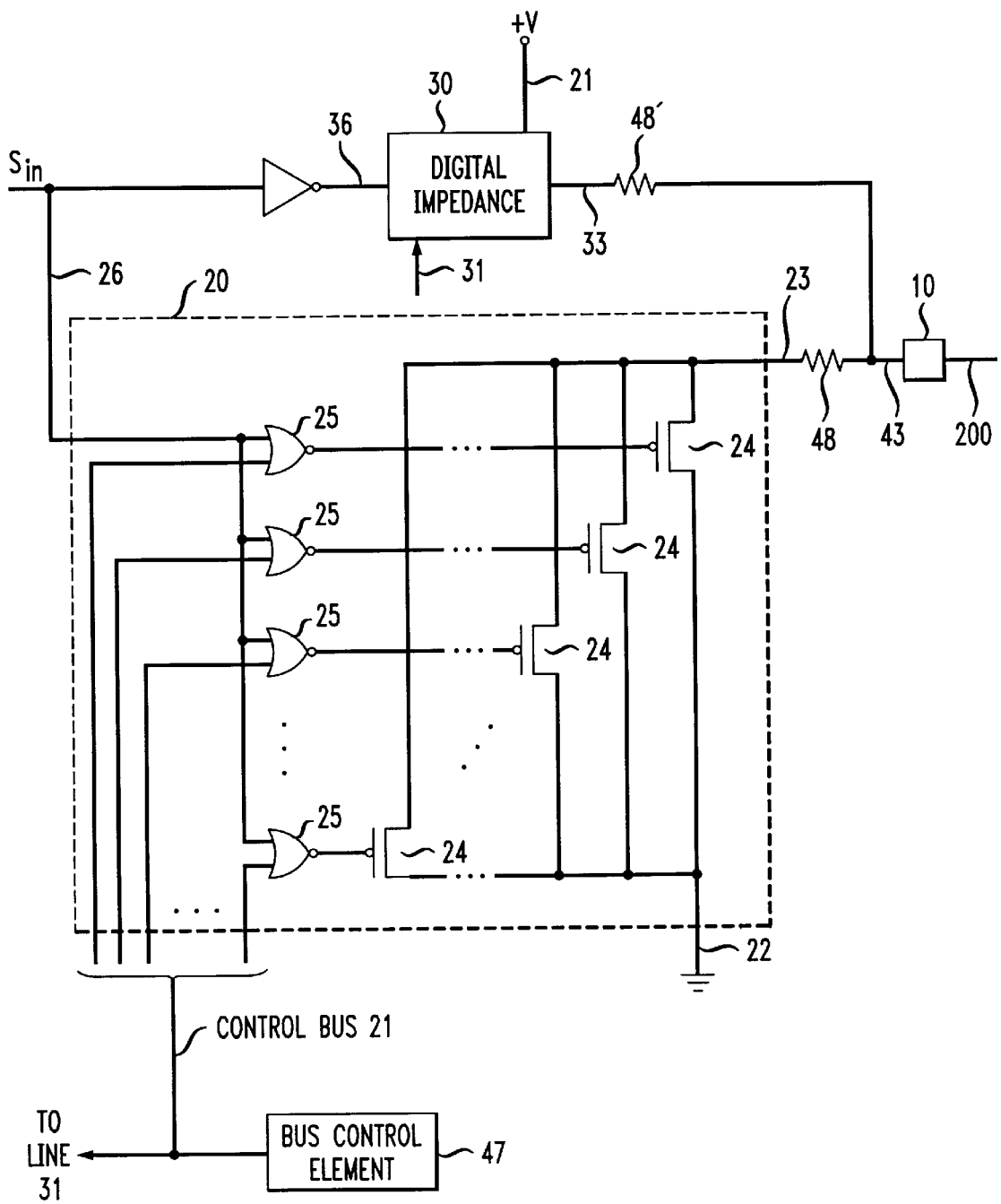
FIG. 5 is a schematic diagram of a portion of a transmission line output buffer in accordance with a first preferred embodiment of the invention.

The present invention is directed to reducing the effects of the nonlinear I–V characteristics inherent in impedance matching components and circuitry. As a preferred embodiment, the present invention is discussed and disclosed with reference to an output impedance buffer circuit. It is to be understood, however, that the present invention is applicable to any circuit or device where linear I–V characteristics are desirable and it is not intended to be limited to the examples and embodiments discussed herein. For example, as illustrated, FIG. 5 depicts the present invention used within a source terminated driver (e.g. a driver which drives an unterminated or open transmission line) using N channel devices controlled by NOR gates 25. It should be understood, however, that the present invention may also be used in a receiver or end terminated driver (e.g. the end of the transmission line being terminated in a characteristic impedance so that any waves propagated down the transmission line are fully absorbed). Additionally, the present invention may use either N-channel devices or P channel devices with the appropriate NOR or NAND gates. The present invention is not intended to be limited to the descriptive embodiments detailed below.

Referring now to FIG. 5, a portion of a transmission line output buffer constructed in accordance with the first preferred embodiment of the present invention is shown. As illustrated, FIG. 5 shows the connection of digital impedance circuit 20 (FIG. 2) to the output terminal 10 through a fixed resistor 48. A similar arrangement is used for the other digital impedance circuit 30. Digitally adjusted transistor array (DTA) 20 is comprised of a parallel interconnection of MOS transistors 24 serially connected between an output terminal 10 and a ground potential terminal 22. Each of the transistors 24 is controlled (at its gate terminal) with a NOR gate 25. Gates 25 are two input gates. One input of each gate 25 is connected to input terminal 26 of the digital impedance circuit 20. The remaining inputs of gates 25 are combined to form the digital control bus (21). A bus control element 47 is provided electrically connected to the control bus 21. A passive resistor 48 is provided in series with the DTA 20 along a conductor to output terminal 10.

Figure 1:
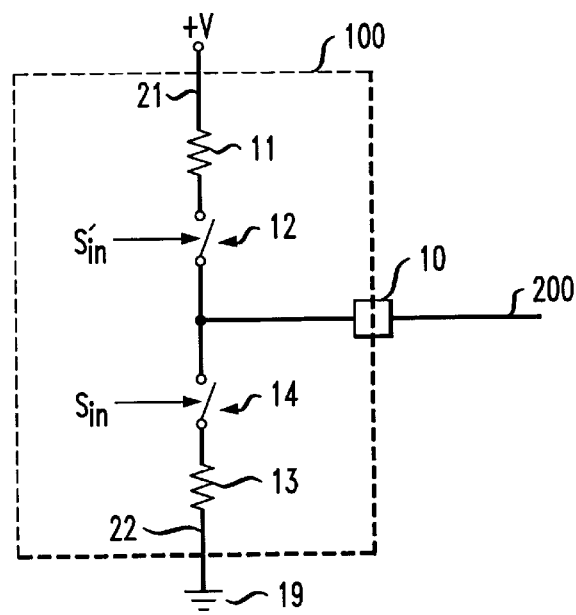
FIG. 1 is a simplified view of a transmission line output buffer circuit.

In operation, the DTA of FIG. 5 processes a logic signal, such as CMOS level signal, which enters the DTA 20 through input terminal 26. The signal on line 26 is the digital logic level signal which is applied to all of the NOR gates 25. The logic level of this signal controls whether any of the transistors 24 are to be turned on, or whether they all remain off. In addition, bus control element 47 adjusts and controls the impedance of circuit 20 through control bus 21 which supplies applied control signals to gates 25 to turn on one or more of transistors 24 thereby selecting an impedance value to produce at terminal 10, an output impedance which matches that of the transmission line, e.g., 200 in FIG. 1. Accordingly, when a signal is processed through the DTA 20, one or more of transistors 24 are fully turned on by signals from the control bus 21 and the current level of the applied logic signal. The transistors 24 are thereby placed in their low impedance state. By placing one or more of the transistors 24 in their low impedance state, the effective impedance between terminals 43 and 22 can be lowered to a desired value from an "open circuit" value.

Figure 2:
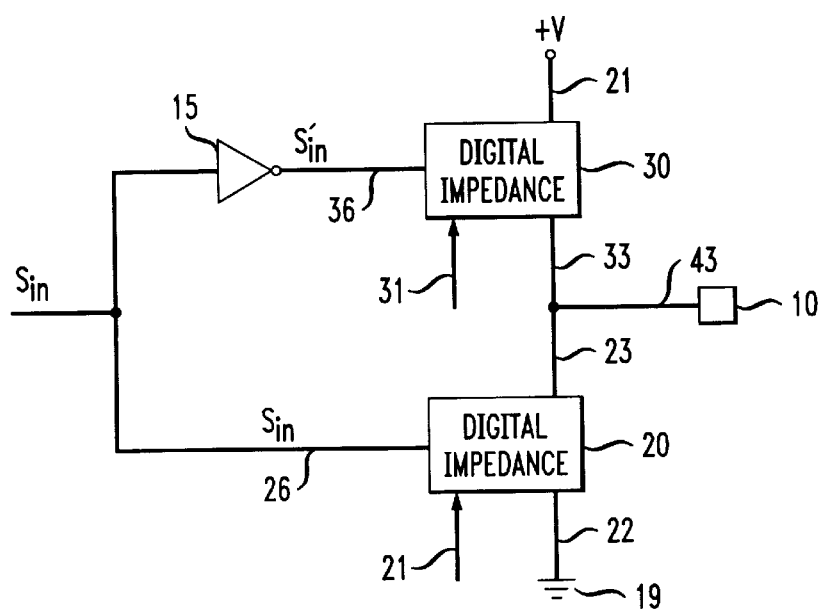
FIG. 2 is a block diagram view of a transmission line output buffer circuit.
Figure 3:
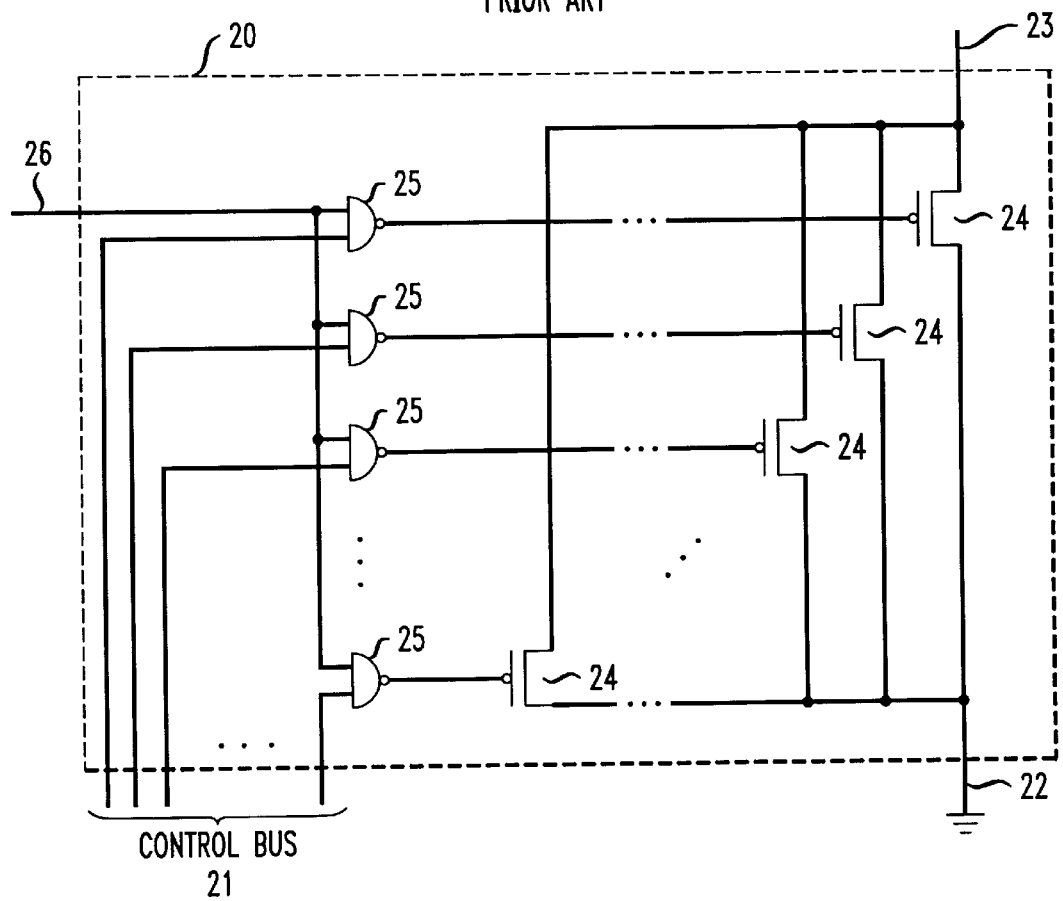
FIG. 3 is a schematic diagram of a digitally adjusted transistor array for the digital impedance circuit 20 of FIG. 2.
Figure 4:
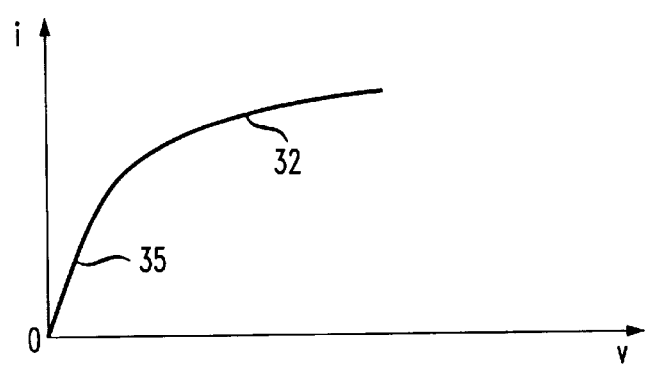
FIG. 4 is a graph of the I/V characteristics of a CMOS impedance element.

As noted, FIG. 5 shows a digitally adjusted variable impedance circuit 20 which supplies a logic signal at a voltage level present on terminal 22, e.g. to output terminal 10 through fixed resistor 48. The remaining portion of the output buffer circuit, which corresponds to the digital impedance circuit 30 of FIG. 2, is likewise used to supply a logic signal at a voltage on a terminal 21, e.g. +V volts or a positive voltage, to output terminal 10 through another fixed resistor 48'.

The control signals supplied from bus control element 47 to the digitally adjusted variable impedance circuits 20 and 30 may be the same or different control signals as necessary for the combined impedance of variable impedance circuit 20 plus fixed impedance 48, as well as for the combined impedance of variable impedance circuit 30 plus fixed impedance 48', to match the characteristic impedance of a transmission line 200 connected to output terminal 10.

A CMOS output buffer terminated with a passive resistor (48, 48') according to the present invention creates a highly linear output impedance over a wide range of processing conditions for the circuit 20,30 transistors and operating conditions.

Figure 6:
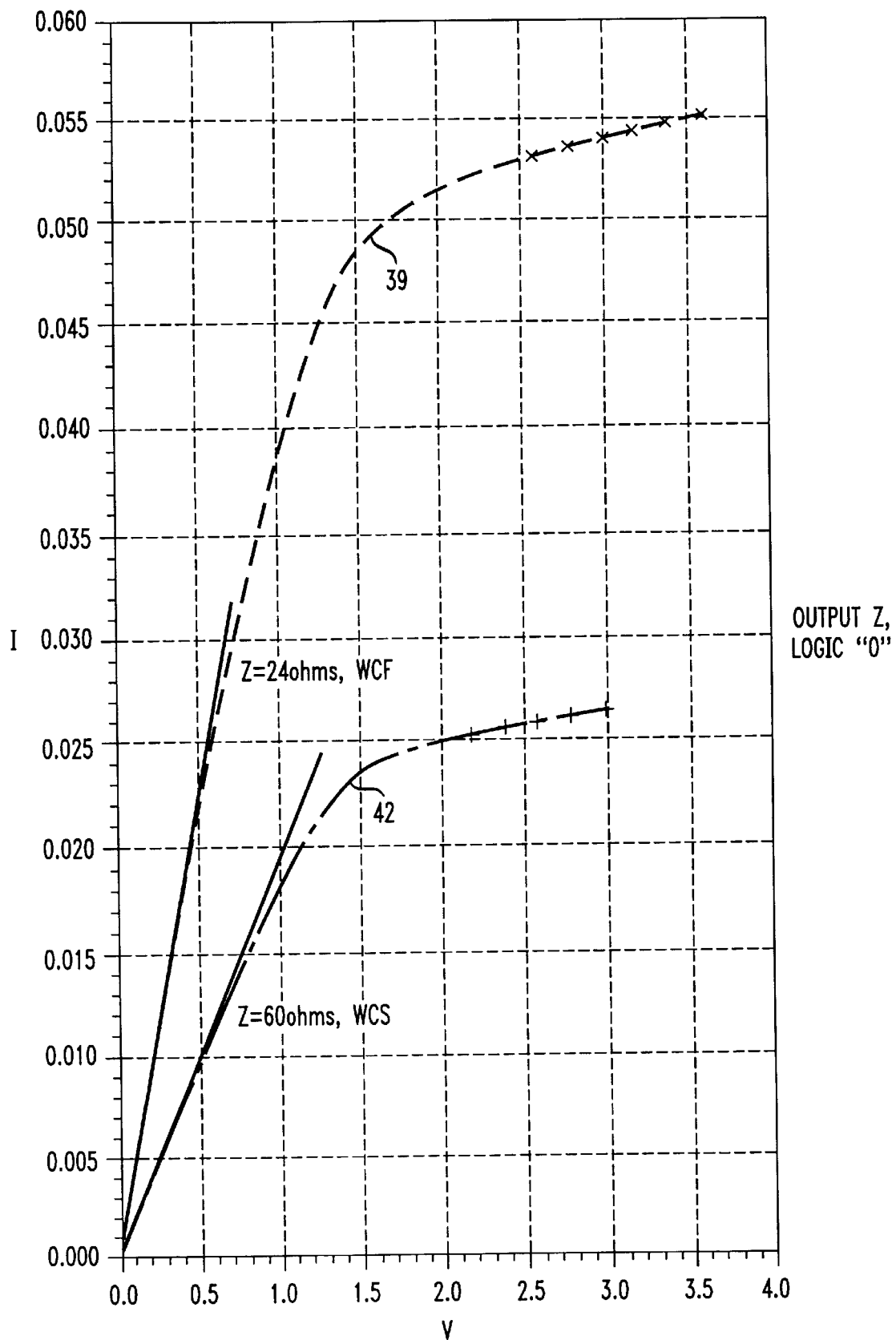
FIG. 6 is a graph of the I/V characteristics of a conventional output buffer in one logic level state.
Figure 7:
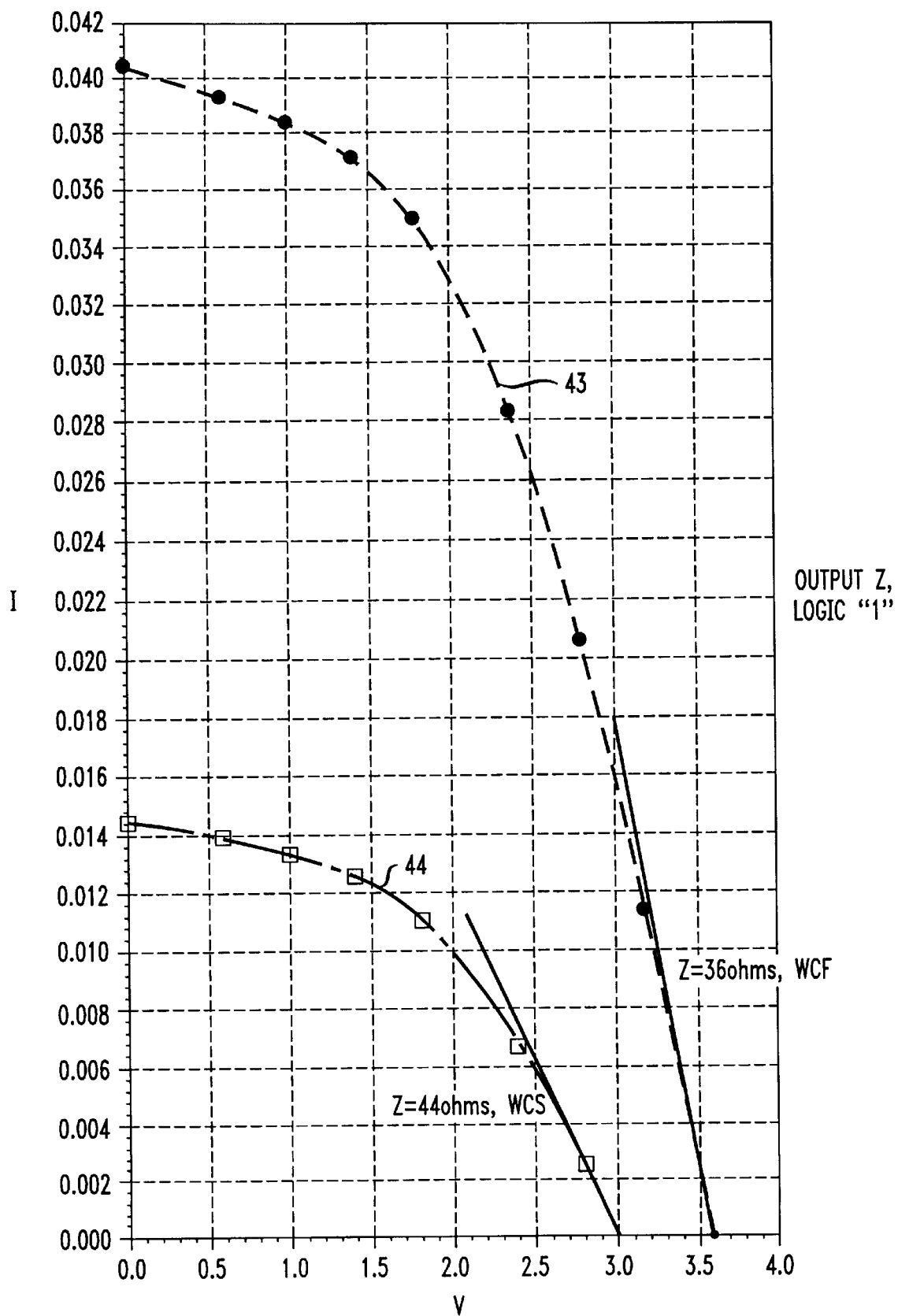
FIG. 7 is a graph of the I/V characteristics of a conventional output buffer in another logic level state.

FIGS. 6 and 7 are I/V graphs of a conventional output buffer driving a logic "0" and "1" respectively. Curves on each graph are plotted for Worst Case Fast (WCF) conditions 39,43 and Worst Case Slow (WCS) conditions 42, 44. WCF implies VDD=3.6V, Temp=0 Deg. C., and fast process (each component's switching times and delay times assumed to be minimal); WCS implies VDD=3.0V, Temp=125Deg. C., and slow process (each component's switching times and delay times assumed to be maximum). As shown in each figure, for each curve 39, 42, 43, 44 the region of linear impedance occurs only at very low voltage and differs considerably for the two process conditions. The slope decreases as the voltage goes higher indicating that the impedance is increasing.

Figure 8:
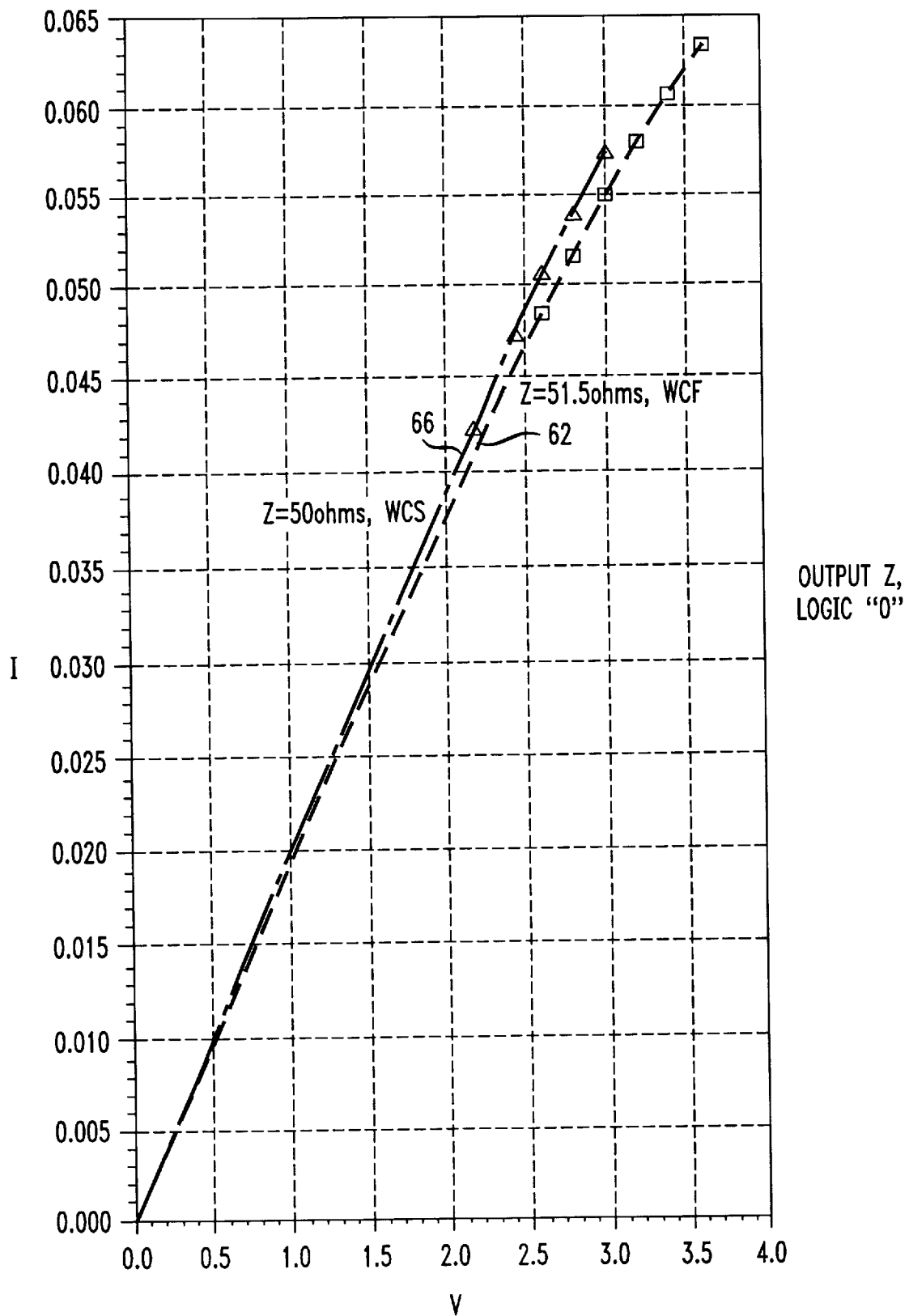
FIG. 8 is a graph of the I/V characteristic of an output buffer according to the present invention in one logic level state.
Figure 9:
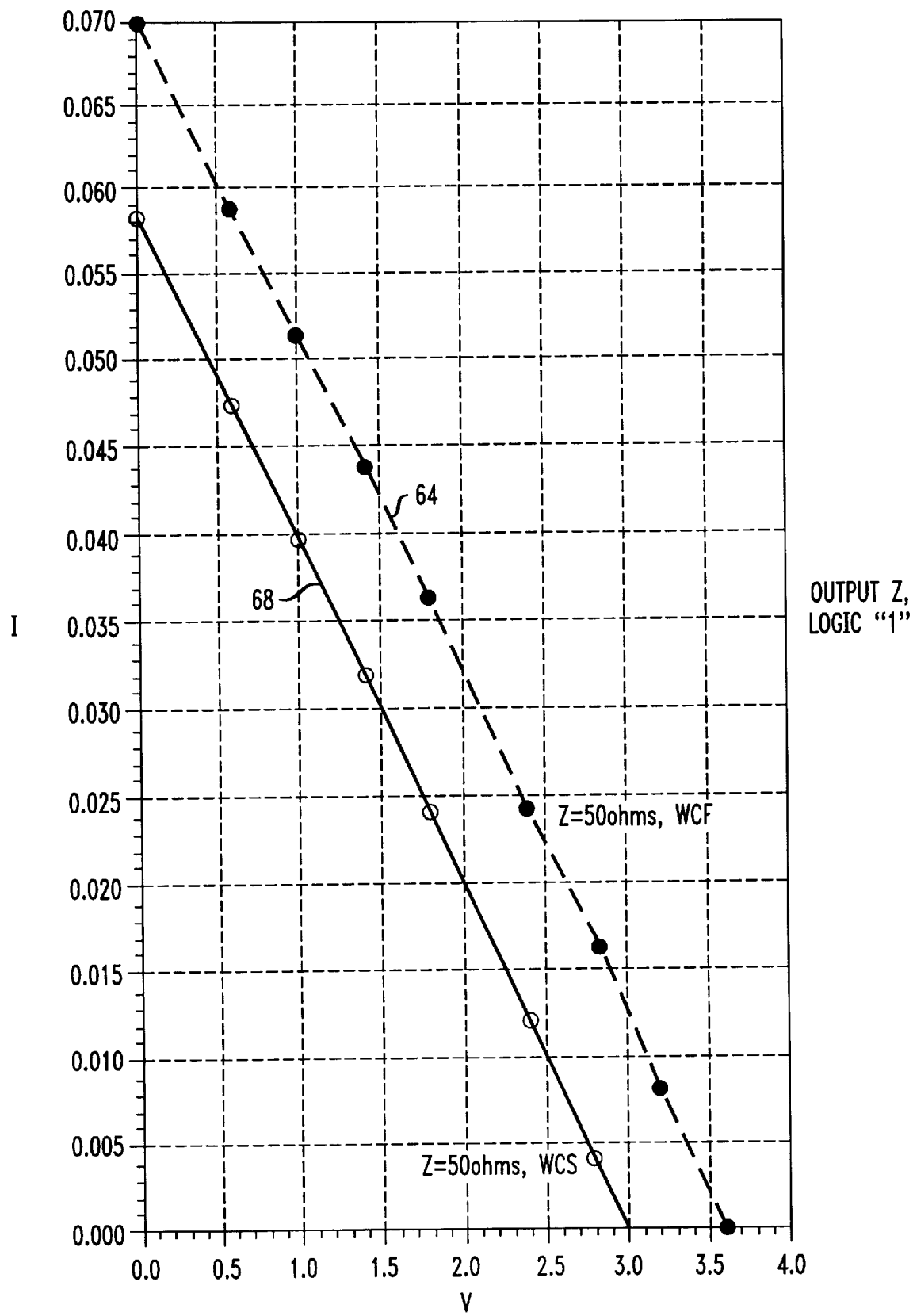
FIG. 9 is a graph of the I/V characteristics of an output buffer according to the present invention in another logic level state.

FIGS. 8 and 9 are I/V graphs of an output buffer in accordance with the first embodiment of the present invention driving a logic "0" and "1" respectively. As in FIGS. 6 and 7, curves are plotted for Worst Case Fast (WCF) conditions 62, 64 and Worst Case Slow (WCS) conditions 66, 68. The linearity of the curves 62, 64, 66, 68 across the voltage swing is evident as is the very small variation in the output impedance for each case.

Figure 10:
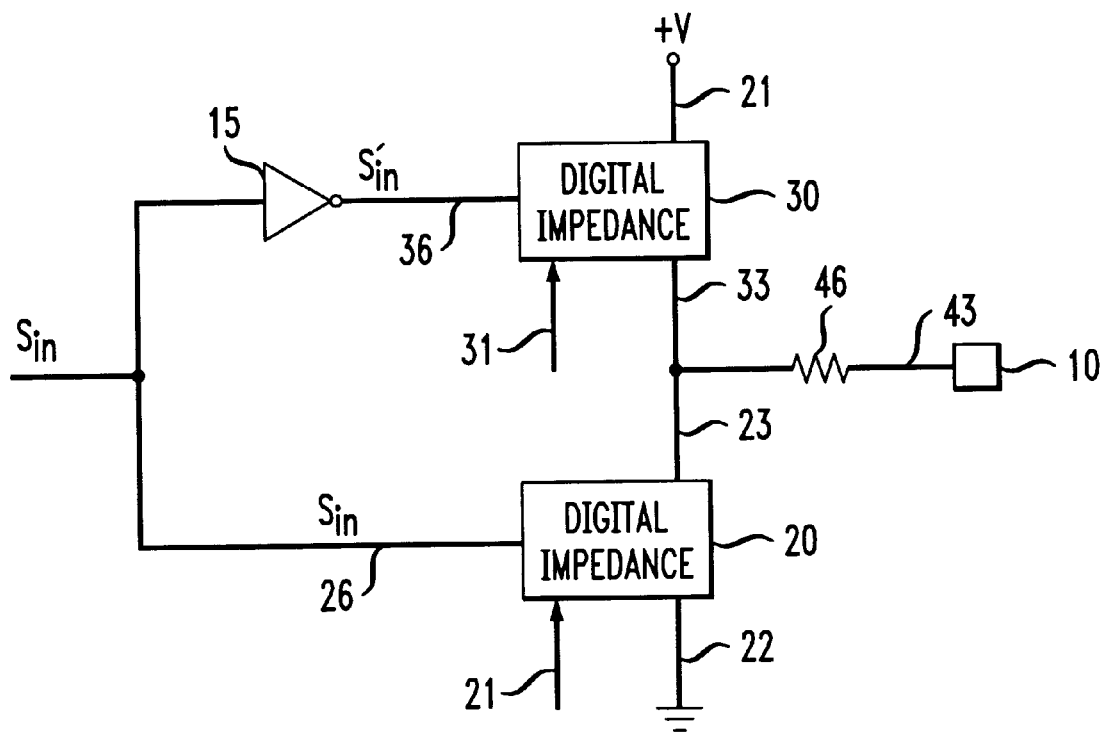
FIG. 10 is a schematic diagram of a transmission line output buffer in accordance with a second preferred embodiment of the invention.

With reference to FIG. 10, an alternative embodiment is disclosed in which a respective passive impedance is not located on the output transmission lines 23, 33 of each individual DTA 20, 30 but rather a single impedance 46 is positioned on a common transmission line 43. Thus, passive impedance 46 is able to serve two adjacent DTAs 20, 30 and provide linearity to input/output signals as detailed above without the need for multiple passive resistors. In all other respects, the FIG. 10 circuit operates like that shown in FIG. 5.

As discussed earlier, while the invention has been described in detail in connection with the preferred embodiments known at the time, it should be readily understood that the invention is not limited to these disclosed embodiments. Rather, the invention can be modified to incorporate any number of variations, alterations, substitutions or equivalent arrangements not heretofore described, but which are commensurate with the spirit and scope of the invention. For instance, FIG. 5 shows in detail a DTA 20 for use in sending a logical 0 and a DTA 30 used for sending a logical 1 signal. It should be understood that each DTA may be used in a high or low state and that the transistors in the DTAs would be appropriately configured for the voltages used. Further, each DTA may be made switchable in and out of electrical connection with said voltage potential terminals and said output terminal.

In addition, the values of the passive resistor(s) used with each embodiment are not limited to any fixed value but rather they may vary based upon the specific application for which the DTA and buffer circuit are used. The passive resistors may also be made switchable in and out of electrical connection with said variable impedances, said voltage potential terminals and said output terminal. Further, one or more fixed resistors connected in series, parallel or a combination of series and parallel may be used for any of the passive resistors 46, 48, or 48'. Accordingly, the invention is not to be seen as limited by the foregoing description, but is only limited by the scope of the appended claims.

What is claimed as new and desired to be protected by Letters Patent of the United States is:

1. An integrated circuit having a variable impedance component comprising:

an output terminal;

a voltage potential terminal;

a variable impedance circuit connected to said voltage potential terminal and said output terminal, the impedance value of said variable impedance circuit being variable in accordance with an applied control signal; and a passive impedance connected in series with said variable impedance circuit and between said voltage potential terminal and said output terminal.

2. The integrated circuit of claim 1, wherein said variable impedance circuit selectively connects said output terminal to said voltage potential terminal.

3. The integrated circuit of claim 1, wherein said passive impedance is located between said variable impedance and said output terminal.

4. The integrated circuit of claim 1, wherein said passive impedance is located between said variable impedance circuit and said voltage potential terminal.

5. The integrated circuit of claim 3, wherein said variable impedance circuit is formed as a digitally adjusted transistor array.

6. The integrated circuit of claim 5, wherein said passive impedance is switchable in and out of electrical connection with said variable impedance circuit, said voltage potential terminal and said output terminal.

7. An integrated circuit having a variable impedance component comprising:

an output terminal;

a first voltage potential terminal;

a second voltage potential terminal;

a first impedance control circuit connected to said output terminal, said first impedance control circuit selectively connecting said output terminal to said first voltage potential terminal through a first variable impedance in response to a first applied logic signal, the impedance of said first variable impedance being variable in accordance with a first applied control signal;

a second impedance control circuit connected to said output terminal, said second impedance control circuit selectively connecting said output terminal to said second voltage potential terminal through a second variable impedance in response to a second applied logic signal, the impedance of said second variable impedance being variable in accordance with a second applied control signal; and at least one passive resistive element which is connected in series with at least one of said first and second variable impedances when said first and second variable impedances are selectively connected to said output terminal and a respective voltage potential terminal.

8. The integrated circuit of claim 7, wherein said first impedance control circuit is comprised of N channel devices and said second impedance control circuit is comprised of P channel devices.

9. The integrated circuit of claim 8, wherein said first and second applied logic signals are the same.

10. The integrated circuit of claim 7, wherein said first and second impedance control circuits selectively connect said output terminal to said first and second voltage potential terminals.

11. The integrated circuit of claim 10, wherein said at least one passive resistive element is a pair of passive resistors respectively located between said variable impedances and said output terminal.

12. The integrated circuit of claim 10, wherein said at least one passive resistive element is a pair of passive resistors respectively located between one of said variable impedances and an associated voltage potential terminal.

13. The integrated circuit of claim 10, wherein said at least one passive resistive element is a passive resistor which is connected with said output terminal and selectively connected with one of said first and second variable impedances.

14. The integrated circuit of claim 8, wherein said first and second variable impedances are formed as digitally adjusted transistor arrays.

15. The integrated circuit of claim 14, wherein at least one of said passive resistive elements is switchable in and out of electrical connection with said variable impedances, said voltage potential terminals and said output terminal.

16. The integrated circuit of claim 14, wherein at least one of said variable impedances is switchable in and out of electrical connection with said voltage potential terminals and said output terminal.

17. An impedance matching output buffer comprising:
an input terminal;
an output terminal;
a first voltage potential terminal;
a second voltage potential terminal;
a first impedance control circuit connected to said input terminal and said output terminal, said first impedance control circuit selectively connecting said output terminal to said first voltage potential terminal through a first variable impedance in response to a first applied logic signal at said input terminal, the impedance of said first variable impedance being variable in accordance with a first applied control signal;
a second impedance control circuit connected to said input terminal and said output terminal, said second impedance control circuit selectively connecting said output terminal to said second voltage potential terminal through a second variable impedance in response to said second applied logic signal at said input terminal, the impedance of said second variable impedance being variable in accordance with a second applied control signal; and
at least one passive resistive element which is connected in series with at least one of said first and second variable impedances when said first and second variable impedances are selectively connected to said output terminal and a respective voltage potential terminal.

18. The output buffer of claim 17, wherein said first and second impedance control circuits selectively connect said output terminal to said first and second voltage potential terminals.

19. The output buffer of claim 18, wherein said at least one passive resistive element is a pair of passive resistors respectively located between at least one of said variable impedances and said output terminal.

20. The output buffer of claim 18, wherein said at least one passive resistive element is a pair of passive resistors respectively located between one of said variable impedances and an associated voltage potential terminal.

21. The output buffer of claim 18, wherein said at least one passive resistive element is a passive resistor which is connected with said output terminal and selectively connected with one of said first and second variable impedances.

22. The output buffer of claim 21, wherein said first and second variable impedances are formed as digitally adjusted transistor arrays.

23. The output buffer of claim 22, wherein said passive resistive elements are switchable in and out of electrical connection with said input terminal, said output terminal, said voltage potential terminals and said impedance control circuits.

24. The output buffer of claim 17, wherein said first impedance control circuit is comprised of N channel devices and said second impedance control circuit is comprised of P channel devices.

25. The output buffer of claim 24, wherein said first and second applied logic signals are the same.

26. A method providing output impedance for a communication path comprising the steps of:
switching a variable impedance element in series between an output terminal connected to said communications path and a voltage potential terminal, in response to an applied logic signal;
adjusting the impedance of said variable impedance element in accordance with an applied control signal; and
connecting a passive resistive element in series with said variable impedance element and between said voltage potential terminal and said output terminal at least when said variable impedance element is switched in series between said output terminal and said voltage potential terminal.

27. The method of claim 26, wherein said passive resistive element is located between said variable impedance and said output terminal.

28. The method of claim 26, wherein said passive resistive element is located between said variable impedance and said voltage potential terminal.

29. The method of claim 28, wherein said variable impedance element is formed as a digitally adjusted transistor array.

30. The method of claim 29, wherein at least one of said passive resistive elements is able to be switched in and out of electrical connection with said input terminal, said output terminal, said voltage potential terminals and said impedance control circuits.

31. A method of providing an output impedance for a communications path comprising the steps of:
switching a first variable impedance in series between an output terminal connectable to said communication path and a first voltage potential terminal in response to a first applied logic signal;
adjusting the impedance with said first variable impedance in accordance with a first applied control signal;
switching a second variable impedance in series between said output terminal and a second voltage potential terminal in response to a second applied logic signal;

adjusting the impedance of said second variable impedance in accordance with a second applied control signal;

connecting at least one passive resistive element in series with said first and second variable impedances at least when said first and second variable impedance are switched in series between said output terminal and a respective voltage potential terminal.

32. The method of claim 31, wherein said at least one passive resistive element is located between said output terminal and a one of said first and second variable impedances which is switched in series between said output terminal and a respective voltage potential terminal.

33. The method of claim 32, wherein said at least one passive resistive element is a pair of passive resistive elements respectively associated with each of said first and second variable impedances.

34. The method of claim 33, wherein each of said pair of passive resistive elements is located between said output terminal and a respective one of said first and second variable impedances.

35. The method of claim 33, wherein each of said pair of passive resistive elements is located between one of said first and second variable impedances and a respective voltage terminal.

36. The method of claim 33, wherein said first and second variable impedances are formed as digitally adjusted transistor arrays.

37. The method of claim 36, wherein said at least one passive resistive element is switchable in and out of electrical connection with said variable impedances, said voltage potential terminals and said output terminal.

* * * * *